United States Patent
McCracken et al.

(10) Patent No.: US 10,038,317 B1
(45) Date of Patent: Jul. 31, 2018

(54) RAPID DISCONNECT SAFETY SYSTEM FOR PHOTOVOLTAIC (PV) SYSTEMS

(71) Applicant: Bentek Corporation, San Jose, CA (US)

(72) Inventors: Douglas Eugene McCracken, San Jose, CA (US); John Herbert Buckley, Austin, TX (US); Mitchell Schoch, Pleasanton, CA (US)

(73) Assignee: BENTEK CORPORATION, San Jose, CA (US)

( * ) Notice: Subject to any disclaimer, the term of this patent is extended or adjusted under 35 U.S.C. 154(b) by 884 days.

(21) Appl. No.: 14/462,470

(22) Filed: Aug. 18, 2014

(51) Int. Cl.
*H02H 5/00* (2006.01)
*H02S 40/36* (2014.01)

(52) U.S. Cl.
CPC .............. *H02H 5/00* (2013.01); *H02S 40/36* (2014.12)

(58) Field of Classification Search
CPC .... H02J 3/383; H02J 3/385; H02J 7/35; H02J 2003/388; Y02E 10/563; Y02E 10/566; Y02E 10/58; Y02T 10/7005; Y02T 10/7077; Y02T 10/7241; H01L 31/02021; B60L 3/0046; B60L 3/04; B60L 2210/221; Y10T 307/707; H03M 7/44
See application file for complete search history.

(56) References Cited

U.S. PATENT DOCUMENTS

| 8,446,042 | B2 | 5/2013 | Bundschuh et al. |
| 8,531,055 | B2 | 9/2013 | Adest et al. |
| 2010/0139734 | A1* | 6/2010 | Hadar ............... H01L 31/02021 136/244 |
| 2011/0088741 | A1 | 4/2011 | Dunton et al. |
| 2012/0281444 | A1* | 11/2012 | Dent ..................... H02M 1/32 363/56.01 |
| 2014/0183950 | A1 | 7/2014 | Kohler |

* cited by examiner

*Primary Examiner* — Thienvu Tran
*Assistant Examiner* — David M Stables
(74) *Attorney, Agent, or Firm* — Brundidge & Stanger, P.C.

(57) ABSTRACT

A system and method for providing a rapid disconnect safety system (RDSS) are disclosed. In a first aspect, the system comprises a rapid shutdown module (RSM) located within a predetermined distance to a photovoltaic (PV) array system and a rapid shutdown controller (RSC) coupled to the RSM, wherein the RSM is remotely located relative to the RSC. When activated, the RSC opens at least one contactor of the RSM to disconnect a PV source circuit of the PV array system. In a second aspect, the method comprises providing a rapid shutdown module (RSM) located within a predetermined distance to a PV array system, coupling a rapid shutdown controller (RSC) to the RSM wherein the RSM is remotely located relative to the RSC, activating the RSC to open at least one contactor of the RSM, and disconnecting a PV source circuit of the PV array system.

18 Claims, 5 Drawing Sheets

RAPID DISCONNECT SAFETY SYSTEM FOR PHOTOVOLTAIC (PV) SYSTEMS

FIELD OF THE INVENTION

The present invention relates to photovoltaic (PV) systems, and more particularly, to a rapid disconnect safety system for PV systems.

BACKGROUND

The photovoltaic (PV) source circuits of PV systems are required to have rapid shutdown systems that are applicable to both commercial and residential buildings. The rapid shutdown systems are used by first responders/fire service personnel to de-energize all PV source circuits on or in a building within 10 seconds of activation. Conventional rapid shutdown systems are costly, inefficient, and inapplicable to certain applications. Therefore, there is a strong need for a solution that overcomes the aforementioned issues. The present invention addresses such a need.

SUMMARY OF THE INVENTION

A system and method for providing a rapid disconnect safety system (RDSS) are disclosed. In a first aspect, the system comprises a rapid shutdown module (RSM) located within a predetermined distance to a photovoltaic (PV) array system and a rapid shutdown controller (RSC) coupled to the RSM, wherein the RSM is remotely located relative to the RSC. When activated, the RSC opens at least one contactor of the RSM to disconnect a PV source circuit of the PV array system.

In a second aspect, the method comprises providing a rapid shutdown module (RSM) located within a predetermined distance to a PV array system, coupling a rapid shutdown controller (RSC) to the RSM wherein the RSM is remotely located relative to the RSC, activating the RSC to open at least one contactor of the RSM, and disconnecting a PV source circuit of the PV array system.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1:
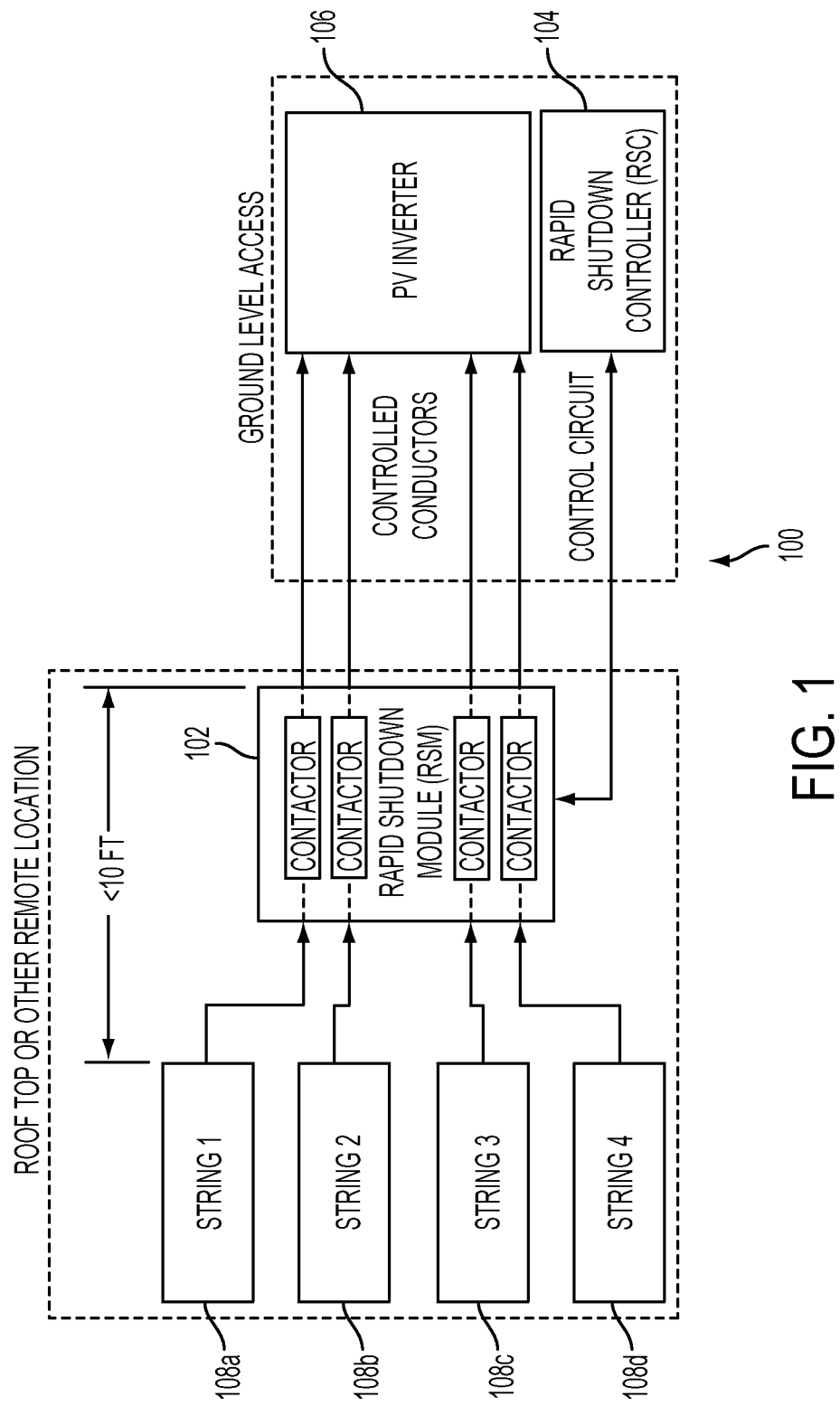
FIG. 1 illustrates a rapid disconnect safety system (RDSS) in accordance with a first embodiment.

The present invention relates to photovoltaic (PV) systems, and more particularly, to a rapid disconnect safety system for PV systems. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Article 690.12 of the 2014 National Electrical Code (NEC) addresses rapid shutdown requirements of PV source circuits that apply to both residential and commercial buildings. Article 690.12 requires a shutdown system that is to be used by first responders/fire service personnel to de-energize all PV source circuits on or in a building within 10 seconds of activation. After shutdown, the resulting controlled conductors must not have any more than 30 volts (V) or 240 volt-amperes (VA) between any two conductors and between any conductor and the ground (conductor ground). Energized conductor lengths inside the building are limited to 1.5 meters (m) or 5 feet (ft) and no more than 3 m (10 ft) from the PV array system outside the building.

A method and system in accordance with the present invention provides safe access rapid shutdown systems that meet a plurality of safety requirements including but not limited to those set forth by Article 690.12 NEC 2014. The safe access rapid shutdown systems include rapid disconnect safety systems for both residential and commercial buildings and inverter Powerskid systems for commercial buildings. The method and system in accordance with the present invention provides a rapid disconnect safety system that enables first responders the ability to rapidly de-energize a building's PV source circuit so they can safely address emergency issues. Including but are not limited to fires, earthquakes, floods, and other natural disasters. The rapid disconnect safety system and product solutions allow the first responders to safely enter the building and begin to address the emergency immediately, without the concern of live electrical wiring and electrical components.

The method and system in accordance with the present invention provides a rapid disconnect safety system (RDSS). In one embodiment, the RDSS is a low-cost system for the residential market that allows residential string inverters and PV systems to meet rapid shutdown requirements. In another embodiment, the RDSS is a cost-effective system for the commercial market that allows commercial centralized inverters and PV systems to meet the rapid shutdown and arc fault requirements. In another embodiment, the RDSS is a cost-effective system that allows decentralized three-phase commercial inverters and PV systems to meet rapid shutdown requirements when the inverter cannot be installed within 10 ft of the PV array system.

The method and system in accordance with the present invention also provides an inverter Powerrack as an innovative racking system for commercial three-phase decentralized inverters. The Powerrack, when integrated with an inverter, is referred to as an inverter Powerskid. Three-phase commercial string inverters located on commercial rooftops within 10 ft for a PV array system also meet the Article 690.12 NEC 2014 requirements. Therefore, when the inverter Powerskid is installed within 10 ft of the PV array system, commercial designers and installers are provided a system that meets Article 690.12 NEC 2014 requirements.

To describe the features of the present invention in more detail, refer now to the following description in conjunction with the accompanying Figures.

Rapid Disconnect Safety System (RDSS):

The rapid disconnect safety system (RDSS) provides a cost effective system that enables residential string inverters to compete with micro inverters (exempt from Article 690.12 NEC 2014 requirements). The RDSS is a two-part system that includes a Rapid Shutdown Controller (RSC) and a Rapid Shutdown Module (RSM). The RSC is accessible at the ground level and controls the RSM that can be located at a variety of remote locations that are compliant with Article 690.12 including but not limited to the rooftop. The RSM is located within a predetermined distance (e.g. 10 feet) of the PV array system and when activated by the RSC, de-energizes the PV output conductors or controlled conductors of the entire PV system.

The Rapid Shutdown Controller (RSC) is an enclosure mounted at the ground-level or at a pre-determined and accessible location to give easy access to the first responders or other individuals. In one embodiment, the RSC includes a main switch that controls a contactor of the RSM by way of either removing or providing power to the RSM contactors. The switching mechanism includes but is not limited to a rotary disconnect switch, a knife blade disconnect switch, a push button, and any other acceptable means for switching an AC or DC control voltage. In one embodiment, the RSC includes a visible or audible indicator feedback of the status of each of the contactors from the RSM.

In one embodiment, the RSC switch utilizes a control circuit and mechanism to interrupt a DC voltage (e.g. 48 VDC, 24 VDC, 12 VDC, etc.) that powers at least one contactor coil of the RSM. The control mechanism can be achieved by interrupting AC voltage (e.g. 480 VAC, 277 VAC, 240 VAC, 208 VAC, 120 VAC, etc.) or by utilizing a communication protocol including but not limited to RS485, RS232, and Ethernet. If a communication protocol is utilized to control the RSM, then the RSM includes a complimentary receiver or controller to communication with the communication protocol.

In one embodiment, the RSC also includes status Light-Emitting Diodes (LEDs) to indicate when the solar power of the PV system is on (active) or off (disabled or disconnected). The status LEDs can be controlled in a variety of ways including but not limited to detecting when the RSC switch is on or off, receiving feedback from the RSM contactors, and receiving inverter status information.

In one embodiment, the RSC also includes an external monitoring feature to enable $3^{rd}$ party devices to monitor the status of the RDSS and also control shutdown and startup features (e.g. timers utilized for pre-determined shutdowns, etc.). The $3^{rd}$ party devices include but are not limited to inverters, home automation systems, data acquisition systems, computing devices, mobile devices, and cloud-based servers.

In one embodiment, the RSC may also include a function/mechanism that enables external control (e.g. remote shutdown or startup via an external control switch, etc.) of the RSM contactors. In this embodiment, the main switch located in the RSC is the master control switch that would override the external control switch for safety. In another embodiment, the external control switch has override functionality.

The Rapid Shutdown Module (RSM) is an enclosure mounted within 10 ft of the PV array system (or solar array system or solar panel system) and provides the rapid shutdown functionality that complies with Article 690.12 NEC 2014. In one embodiment, the RSM includes a plurality of contactors that provide a disconnection mechanism for each individual PV string of solar panels of the plurality of PV strings of the PV array system. Each individual PV string is passed through the RSM and to one of the plurality of contactors without combining the plurality of PV strings into a larger current or larger conductor output to enable string inverters that require individual string input to fully utilizing maximum power point tracking (MPPT) and to properly operate the arc fault detection inverter. The arc fault detection inverter is designed to prevent fires by detecting an unintended electrical arc and disconnecting the power before the arc starts a fire.

In one embodiment, any of at least one string and a plurality of strings are passed through the RSM. The plurality of strings includes but is not limited to four strings. In one embodiment, each RSM module is capable of housing a predetermined number of strings threshold. In another embodiment, additional RSM modules are utilized if the number of strings in the PV array system exceeds the predetermined number of strings threshold for each individual RSM module. In one embodiment, each RSC is capable of controlling up to a predetermined number of strings including but not limited to 16 strings.

In one embodiment, the plurality of strings are connected to the RSM in a variety of ways including but not limited to using PV connectors, using cabled whips, and directly wiring them using glands or sealed access points. In another embodiment, fusing the plurality of strings to the RSM is provided if required by the PV installation.

When first responders arrive at the scene of an emergency and at a building with a PV system that includes a PV source circuit, the PV source circuit is de-energized by activating the ground-level RSC. The first responder pushes a visible and accessible button including but not limited to an emergency off (EMO) button. In one embodiment, the button is enclosed within a clear cover of the RSC. In another embodiment, the cover of the RSC is automatically opened utilizing an authentication process. One of ordinary skill in the art readily recognizes that the cover of the RSC can be a variety of colors including but not limited to clear, white, transparent, and red and that would be within the spirit and scope of the present invention.

After the EMO button is pushed, an LED indicator goes from "Solar On" to "Solar Off" and the RSC opens a contactor located within the RSM that is mounted (e.g. mounted on the rooftop of the building). Once the contactor is open, the entire PV source circuit is disabled or disconnected within 10 seconds of activation (e.g. pushing of the EMO button). After activation, there is less than 30V or 240 VA between any two conductors and the conductor ground, thereby meeting the Article 690.12 NEC 2014 requirements. In one embodiment, to reset and close the contactor(s) located within the RSM thereby enabling or connecting the entire PV source circuit, the EMO button is turned in a predetermined orientation including but not limited to clockwise.

In one embodiment where an extra level of safety is desired, the ground-level RSC includes a load-break disconnect switch. The disconnect switch can be interlocked with the RSM that is on the rooftop. The interlocking of the ground-level disconnect switch and the rooftop RSM provides an extra level of safety for first responders when entering the building because it disables or disconnects the PV system at both the ground-level and the rooftop. One of ordinary skill in the art readily recognizes that the RSM can be located on another location other than the rooftop such as a remote location and that would be within the spirit and scope of the present invention.

In another embodiment where an extra level of safety is desired, the RDSS is connected to any of a business alarm system, a home alarm system, and a cloud-based computing and network system via protocols including but not limited to the Internet, WiFi, etc. In this embodiment, the alarm company associated with the business or the home alarm system or a user of the cloud-based computing and network system can then remotely shutdown and disable or disconnect the PV system before the first responders arrive. Therefore, through this option, remote access can be given to the business that owns and/or rents the commercial building or to the homeowner that owns the residential building to shut down the PV system via a computer and/or cell phone device.

FIG. 1 illustrates a rapid disconnect safety system (RDSS) 100 in accordance with a first embodiment. The RDSS 100 includes a rapid shutdown module (RSM) 102, a rapid shutdown controller (RSC) 104 coupled to the RSM 102, a photovoltaic (PV) inverter 106 (e.g. a residential PV string inverter) coupled to the RSM 102, and a plurality of PV strings 108a-d each coupled to the RSM 102. Each of the plurality of PV strings 108a-d is comprised of a plurality of solar panels and corresponding PV source circuits and combine together to form a PV array system.

In one embodiment, each of the plurality of PV strings 108a-d is within a predetermined distance (e.g. 10 ft) of the RSM 102. The plurality of PV strings 108a-d and the RSM 102 are both located on the residential building rooftop or in another remote location. The RSC 104 and the PV inverter 106 are both located on the ground-level. Once activated, the RSC 104 disables or disconnects the RSM 102 via a control circuit (e.g. a low voltage control circuit) to de-energize the plurality of PV strings 108a-d within a predetermined time period (e.g. 10 seconds). In one embodiment, the RSC 104 disables or disconnects the RSM 102 by opening at least one contactor of the RSM 102. Once disabled or disconnected, the RSM 102 ensures that the resulting controlled conductors of the PV inverter 106 do not have any more than a predetermined energy level (e.g. 30V or 240 VA) between any two conductors and/or between any conductor and the ground.

Figure 2:
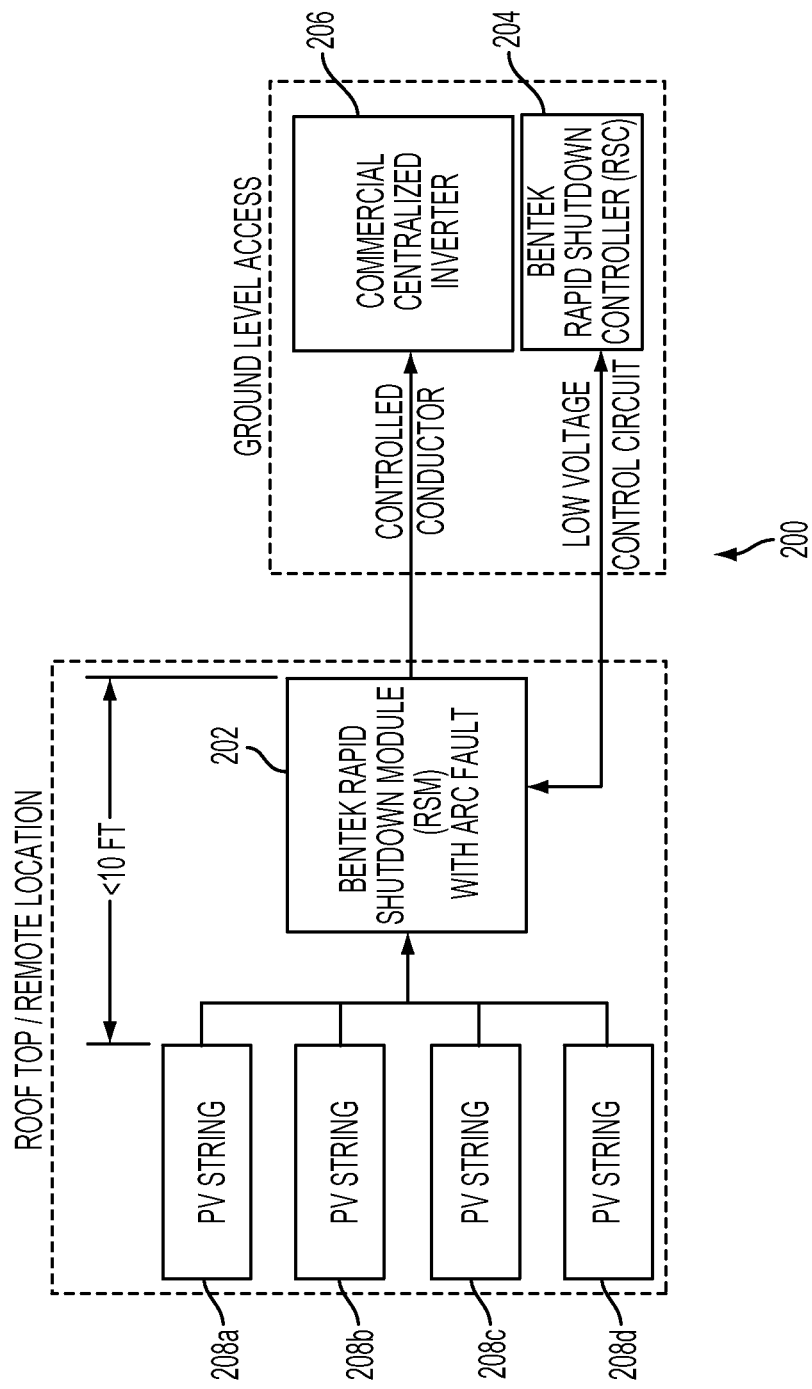
FIG. 2 illustrates a RDSS in accordance with a second embodiment.

The rapid disconnect safety system (RDSS) of FIG. 1 that is applied to a residential setting/building can also be applied to a commercial setting/building. FIG. 2 illustrates a rapid disconnect safety system (RDSS) 200 in accordance with a second embodiment. The RDSS 200 includes a rapid shutdown module (RSM) 202, a rapid shutdown controller (RSC) 204 coupled to the RSM 202, a commercial centralized inverter 206 coupled to the RSM 202, and a plurality of strings 208a-d each coupled to the RSM 202. Each of the plurality of strings 208a-d is comprised of a plurality of solar panels and corresponding PV source circuits and combine together to form a PV array system. In one embodiment, the RSM 202 includes an arc fault detection inverter.

In one embodiment, each of the plurality of strings 208a-d is within a predetermined distance (e.g. 10 ft) of the RSM 202. The plurality of strings 208a-d and the RSM 202 are both located on the commercial building rooftop or in another remote location. The RSC 204 and the commercial centralized inverter 206 are both located on the ground-level. Once activated, the RSC 204 disables or disconnects the RSM 202 via a control circuit (e.g. a low voltage control circuit) to de-energize the plurality of strings 208a-d within a predetermined time period (e.g. 10 seconds). In one embodiment, the RSC 204 disables or disconnects the RSM 202 by opening at least one contactor of the RSM 202. Once disabled or disconnected, the RSM 202 ensures that the resulting controlled conductors of the commercial centralized inverter 206 do not have any more than a predetermined energy level (e.g. 30V or 240 VA) between any two conductors and/or between any conductor and the ground.

Figure 3:
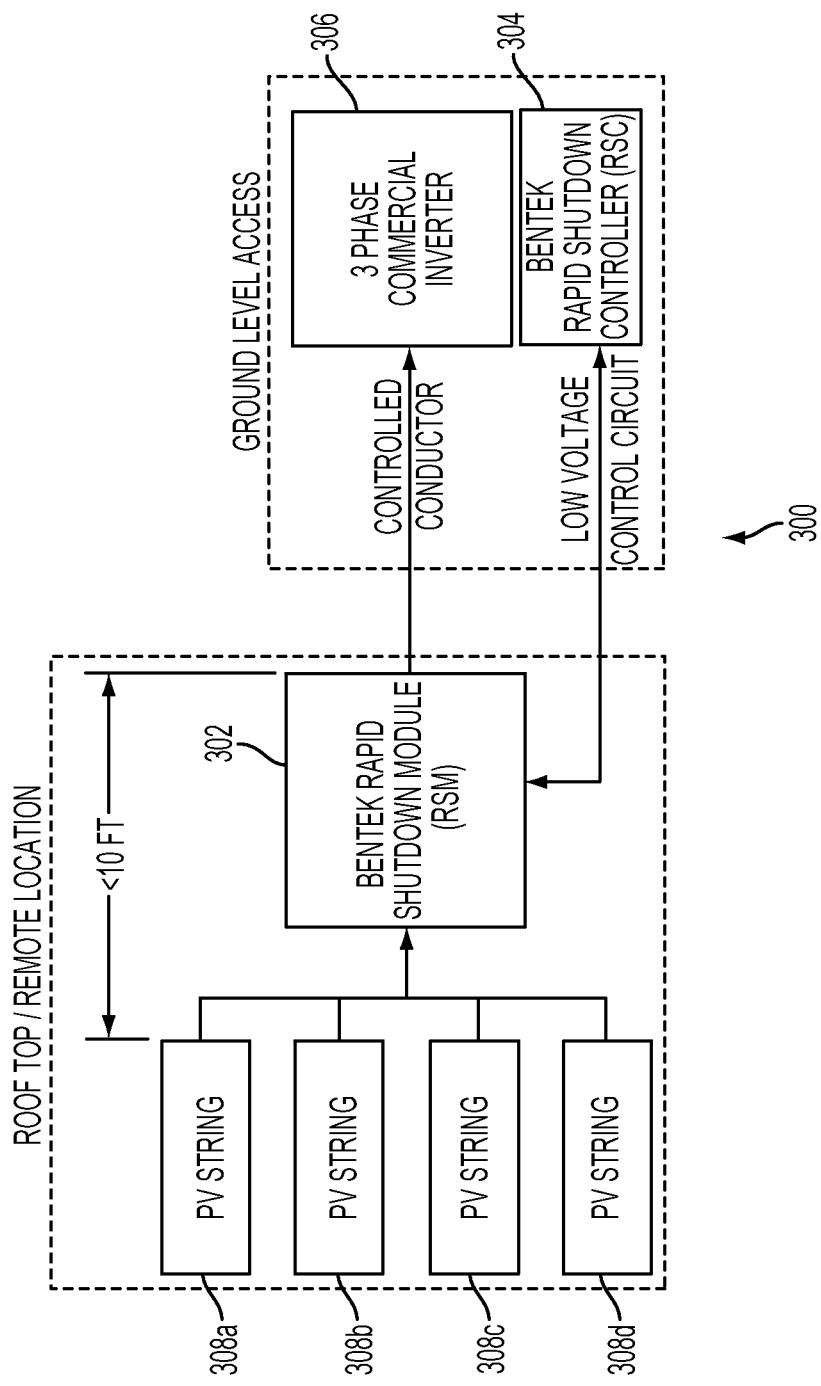
FIG. 3 illustrates a RDSS in accordance with a third embodiment.

The rapid disconnect safety system (RDSS) of FIG. 2 that is applied to a commercial setting/building with a centralized inverter can also be applied to a commercial setting/building with a decentralized inverter. FIG. 3 illustrates a rapid disconnect safety system (RDSS) 300 in accordance with a second embodiment. The RDSS 300 includes a rapid shutdown module (RSM) 302, a rapid shutdown controller (RSC) 304 coupled to the RSM 302, a commercial decentralized 3-phase inverter 306 coupled to the RSM 302, and a plurality of strings 308a-d each coupled to the RSM 302. Each of the plurality of strings 308a-d is comprised of a plurality of solar panels and corresponding PV source circuits and combine together to form a PV array system.

In one embodiment, each of the plurality of strings 308a-d is within a predetermined distance (e.g. 10 ft) of the RSM 302. The plurality of strings 308a-d and the RSM 302 are both located on the commercial building rooftop or in another remote location. The RSC 304 and the commercial decentralized 3-phase inverter 306 are both located on the ground-level. Once activated, the RSC 304 disables or disconnects the RSM 302 via a control circuit (e.g. a low voltage control circuit) to de-energize the plurality of strings 308a-d within a predetermined time period (e.g. 10 seconds). In one embodiment, the RSC 304 disables or disconnects the RSM 302 by opening at least one contactor of the RSM 302. Once disabled or disconnected, the RSM 302 ensures that the resulting controlled conductors of the commercial centralized inverter 306 do not have any more than a predetermined energy level (e.g. 30V or 240 VA) between any two conductors and/or between any conductor and the ground.

In one embodiment, the RDSS 300 enables compliance with safety requirements including but not limited to Article 690.12 NEC 2014 when 3-phase inverters cannot be installed on an inverter Powerskid system located within 10 ft of the PV array system.

In one embodiment, the RSC provides a variety of additional benefits and features including but not limited to providing: a control system for the rapid shutdown of a complete residential and/or commercial PV array system; remote and wireless activation and notification; real-time status indication; lightweight assembly that is easy to handle and integrate; an easily detectable colored (e.g. red) enclosure for first responders; the ability to be easily mounted at ground-level; an aesthetically designed polycarbonate enclosure (e.g. NEMA 3R or 4X polycarbonate); easy to read green LED status indicator light for "Solar On" and red LED status indicator light for "Solar Off" that is activated by the disconnection of the PV source circuit or a circuit break; a lock out tag for a solar emergency shutdown/off (EMO) button; a sealed dead-front that covers all live parts for additional safety; support for both transformer and transformerless inverters; a capability to interlock a ground mount disconnect with a rooftop contact combiner for additional safety; and bulkhead connectors for easy plug and play installation.

In one embodiment, the RSM provides a variety of additional benefits and features including but not limited to providing: the mechanism for the rapid shutdown of a complete residential and/or commercial PV array system; remote and wireless activation and notification; real-time status indication; quick and easy installation on the back of PV panels or a PV rooftop racking; an aesthetically designed polycarbonate assembly (e.g. NEMA 3R or 4X polycarbonate); a sealed enclosure that covers all live parts for additional safety; grounded configuration to support transformer inverters; ungrounded configuration to support transformerless inverters; and bulkhead connectors for easy plug and play installation with RSC and PV array systems.

Inverter Powerskid System:

The inverter Powerskid system provides a system that can be installed within 10 ft of the PV array. When the Powerskid is installed within 10 ft of the PV array, commercial designers and installers are provided with a system that meets Article 690.12 NEC 2014 requirements because disabling the inverter on the Powerskid de-energies the PV source circuit for first responders. If the inverter Powerskid cannot be installed within 10 ft of the PV array, the RDSS 300 system can be utilized.

Figure 4:
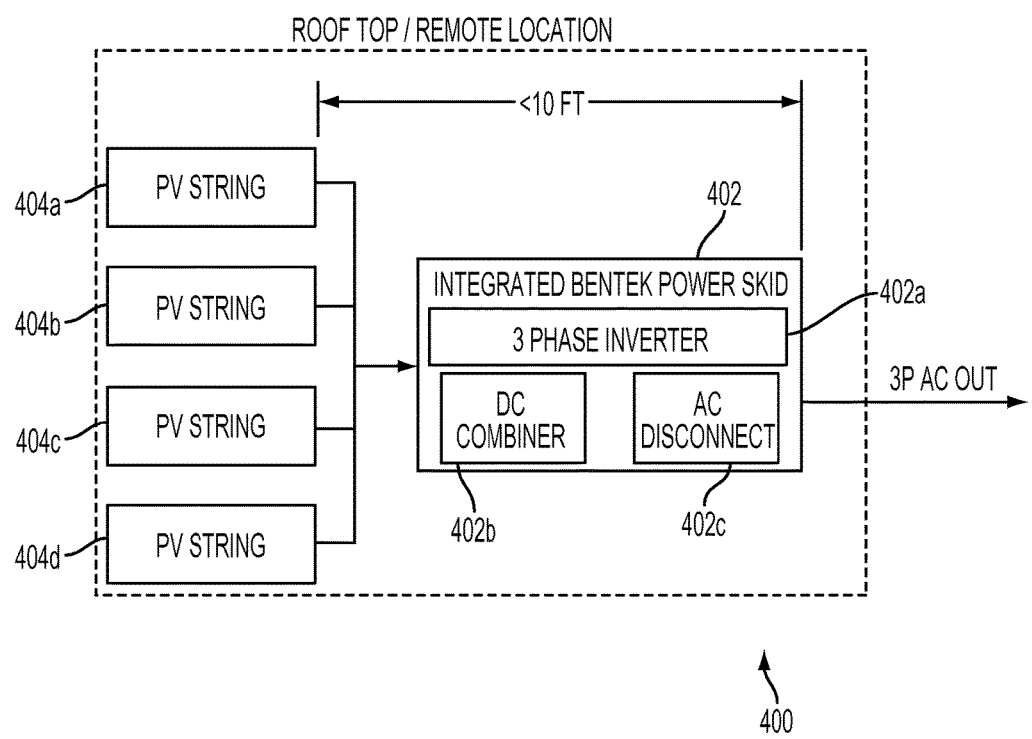
FIG. 4 illustrates an inverter Powerskid system in accordance with an embodiment.

FIG. 4 illustrates an inverter Powerskid system 400 in accordance with an embodiment. The inverter Powerskid system 400 includes an integrated Powerskid 402 coupled to a plurality of strings 404a-d. The integrated Powerskid 402 includes a 3-phase inverter 402a, a DC combiner 402b, and a AC disconnect 402c to provide a 3-phase AC output.

Figure 5:
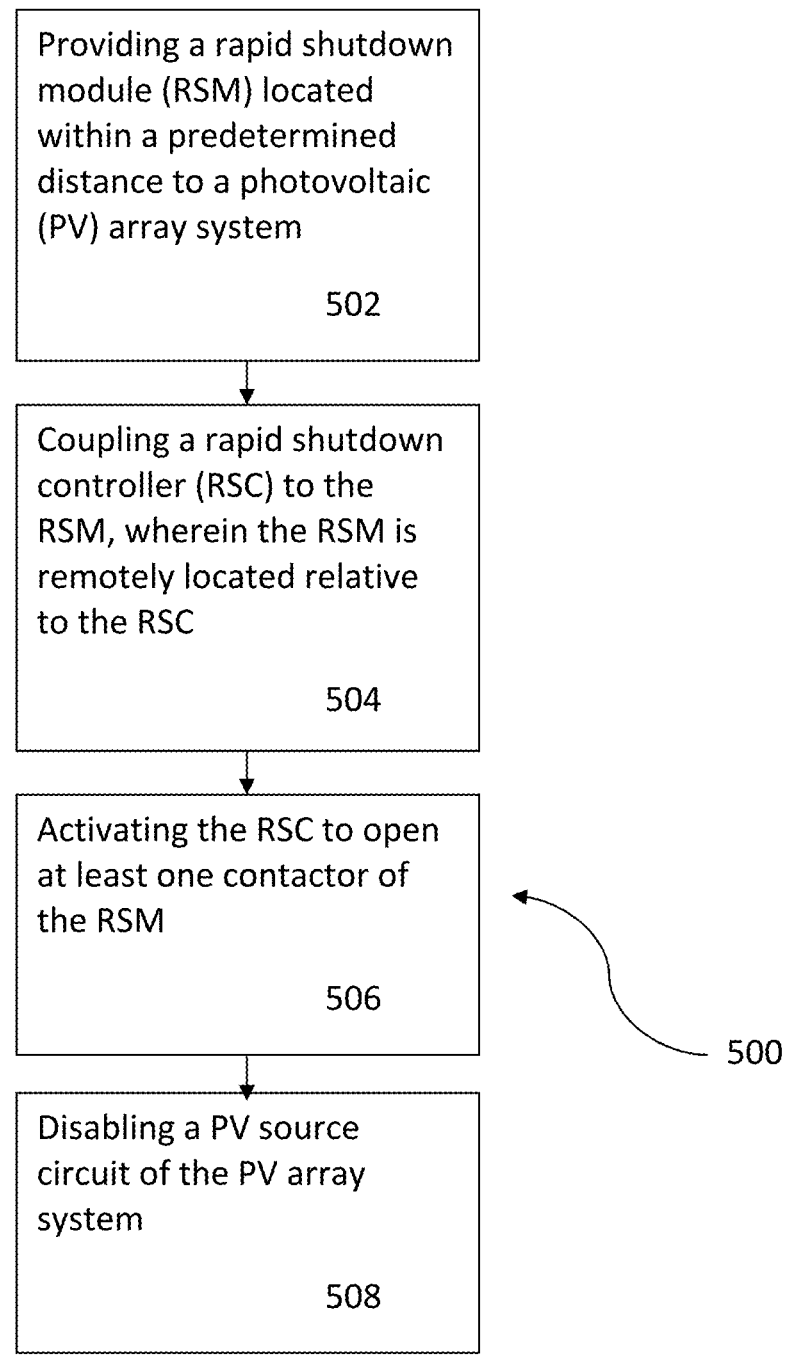
FIG. 5 illustrates a method for providing a rapid disconnect safety system (RDSS) in accordance with an embodiment.

FIG. 5 illustrates a method 500 for providing a rapid disconnect safety system (RDSS) in accordance with an embodiment. The method 500 includes providing a rapid shutdown module (RSM) located within a predetermined distance to a photovoltaic (PV) array system, coupling a rapid shutdown controller (RSC) to the RSM wherein the RSM is remotely located relative to the RSC, activating the RSC to open at least one contactor of the RSM, and disabling or disconnecting a PV source circuit of the PV array system.

In one embodiment, the method 500 further includes coupling the RSM to a location (e.g. a rooftop) within 10 feet (ft) of the PV array system and coupling the RSC at ground-level to provide user access. In another embodiment, the method 500 further includes coupling a remote access system to the RSC, wherein the remote access system enables remote disabling or disconnecting of the PV array system.

In one embodiment, the method 500 further includes passing each individual string of a plurality of strings of the PV array system through the RSM without combining the plurality of strings into a conductor output, interlocking a load-break disconnect switch with the RSM to enable the disabling or disconnecting of the PV array system from both the ground-level and the rooftop, and switching a status indicator from a "On" status to a "Off" status on a LED module of the RSC once a main switch (e.g. a button) of the RSC is selected.

As above described, a method and system in accordance with the present invention provides access rapid shutdown systems that meet rapid shutdown requirements for PV systems. By providing a rapid shutdown module (RSM) and a rapid shutdown controller (RSC), a PV source circuit of a PV array system can be disabled or disconnected within 10 seconds by first responders or users using an activation mechanism (e.g. main switch) of the RSC. Once activated (either directly via the main switch of the RSC or remotely via a remote access system), the RSC opens a contactor located in the RSM to disable or disconnect the PV source circuit and meet the less than 30V or 240 VA between any two conductors and the conductor ground safety requirements.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A rapid disconnect safety system (RDSS), comprising:
   a rapid shutdown module (RSM) located within a predetermined distance to a PV array system; and
   a manually activated rapid shutdown controller (RSC) coupled to the RSM, wherein the RSM is remotely located relative to the RSC, wherein when manually activated the RSC opens at least one contactor of the RSM to disconnect a photovoltaic (PV) source circuit of the PV array system;
   wherein the RSM includes a module that houses a plurality of contactors that each provide a disconnect mechanism for each individual string of a plurality of strings of the PV array system.

2. The system of claim 1, wherein the RSM is mounted on a location within 10 feet (ft) of the PV array system.

3. The system of claim 2, wherein the RSC is mounted at ground-level to provide user access.

4. The system of claim 3, wherein the RSC includes a load-break disconnect switch interlocked with the RSM to enable the disconnecting of the PV array system from both the ground-level and the location.

5. The system of claim 1, wherein the PV source circuit is disconnected within 10 seconds (s) of the manual activation.

6. The system of claim 1, wherein there is less than any of 30 Volts (V) and 240 Volt-amperes (VA) between any two conductors and a conductor ground of the PV array system.

7. The system of claim 1, further comprising:
   a remote access system coupled to the RSC, wherein the remote access system enables remote disconnecting of the PV array system.

8. The system of claim 7, wherein the remote access system includes any of a business alarm system, a home alarm system, a cloud-based computing system, a computing device, and a mobile device.

9. The system of claim 1, wherein each individual string is passed through the RSM without combining the plurality of strings into a conductor output.

10. The system of claim 1, wherein the RSC includes a main switch that activates the RSC once manually selected.

11. The system of claim 10, wherein the main switch includes any manually operated one of an emergency off (EMO) button, a rotary disconnect switch, a knife blade disconnect switch, a push button, and any other mechanism for switching a control voltage.

12. The system of claim 10, wherein the RSC includes an LED module that shifts from an "On" status indicator to a "Off" status indicator once the main switch is manually selected and the PV source circuit is disconnected.

13. The system of claim 10, wherein the RSC further includes an external switch that activates the RSC once manually selected, further wherein the main switch overrides the external switch.

14. A method for providing a rapid disconnect safety system (RDSS), comprising:
   providing a rapid shutdown module (RSM) located within a predetermined distance to a PV array system;
   coupling a manually activated rapid shutdown controller (RSC) to the RSM, wherein the RSM is remotely located relative to the RSC;

passing each individual string of a plurality of strings of the PV array system through the RSM without combining the plurality of strings into a conductor output;

manually activating the RSC to open at least one contactor of the RSM; and disconnecting a photovoltaic (PV) source circuit of the PV array system.

15. The method of claim 14, further comprising:

coupling the RSM to a location within 10 feet (ft) of the PV array system; and coupling the RSC at ground-level to provide manual user access.

16. The method of claim 15, further comprising:

interlocking a load-break disconnect switch with the RSM to enable the disconnecting of the PV array system from both the ground-level and the location.

17. The method of claim 14, further comprising:

coupling a remote access system to the RSC, wherein the remote access system enables remote disconnecting of the PV array system.

18. The method of claim 14, further comprising:

switching a status indicator from a "On" status to a "Off" status on a LED module of the RSC once a main switch of the RSC is selected and the PV source circuit is disconnected.

* * * * *